(12) United States Patent
Tu et al.

(10) Patent No.: US 11,742,422 B2
(45) Date of Patent: Aug. 29, 2023

(54) SEMICONDUCTOR DEVICE AND METHOD OF FABRICATING THE SAME

(71) Applicant: MACRONIX International Co., Ltd., Hsinchu (TW)

(72) Inventors: Shuo-Lun Tu, Hsinchu (TW); Shyi-Yuan Wu, Hsin-Chu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/473,730

(22) Filed: Sep. 13, 2021

(65) Prior Publication Data

US 2023/0081508 A1 Mar. 16, 2023

(51) Int. Cl.
| | |
|---|---|
| H01L 29/78 | (2006.01) |
| H01L 29/66 | (2006.01) |
| H01L 29/40 | (2006.01) |
| H01L 29/06 | (2006.01) |

(52) U.S. Cl.
CPC ...... *H01L 29/7823* (2013.01); *H01L 29/0607* (2013.01); *H01L 29/401* (2013.01); *H01L 29/402* (2013.01); *H01L 29/66681* (2013.01)

(58) Field of Classification Search
None
See application file for complete search history.

(56) References Cited

U.S. PATENT DOCUMENTS

| | | | | |
|---|---|---|---|---|
| 9,029,976 | B1 * | 5/2015 | Hung | H01L 29/735 |
| | | | | 257/491 |
| 10,879,236 | B2 | 12/2020 | Murukesan et al. | |
| 2014/0232513 | A1 | 8/2014 | Chan et al. | |
| 2016/0126237 | A1 * | 5/2016 | Chen | H01L 29/0821 |
| | | | | 257/337 |
| 2018/0033854 | A1 * | 2/2018 | Kaya | H01L 29/7835 |
| 2022/0367712 | A1 * | 11/2022 | Qiao | H01L 29/0696 |

FOREIGN PATENT DOCUMENTS

| | | |
|---|---|---|
| TW | 201334186 | 8/2013 |
| TW | 201601318 | 1/2016 |
| TW | 201826496 | 7/2018 |
| TW | 202105745 | 2/2021 |
| TW | 202121632 | 6/2021 |

OTHER PUBLICATIONS

"Office Action of Taiwan Counterpart Application", dated Aug. 31, 2022, p. 1-p. 5.

* cited by examiner

*Primary Examiner* — Khaja Ahmad
(74) *Attorney, Agent, or Firm* — J.C. Patents

(57) ABSTRACT

A semiconductor device includes: a substrate; a source region and a drain region located in the substrate; a gate structure located in the substrate between the source region and the drain region; an insulating layer located between the gate structure and the drain region; a plurality of field plates located on the insulating layer, wherein the field plate closest to the gate structure is electrically connected to the source region; a first well region located in the substrate; a body contact region located in the first well region, wherein the body contact region is electrically connected to the source region and the field plate closest to the gate structure; and a first doped drift region located in the substrate, wherein the gate structure is located between the first well region and the first doped drift region, and the drain region is located in the first doped drift region.

16 Claims, 9 Drawing Sheets

SEMICONDUCTOR DEVICE AND METHOD OF FABRICATING THE SAME

BACKGROUND OF THE INVENTION

Field of the Invention

The embodiments of the invention relate to a semiconductor device and a method of fabricating the same.

Description of Related Art

A high-voltage (HV) transistor (such as a metal-oxide-semiconductor field-effect transistor (MOSFET)) may be used as a high-voltage switching regulator and a high-voltage switch in a power management integrated circuit (IC). In order to deal with the high voltages involved in these and other high-voltage applications, the high voltage transistor preferably has high breakdown voltage and low on-resistance.

SUMMARY OF THE INVENTION

The embodiments of the invention propose various semiconductor devices that can reduce gate-drain capacitance (Cgd) and switching power loss, and can make the devices have high breakdown voltage and low on-resistance.

In an embodiment of the invention, a semiconductor device includes: a substrate; a source region and a drain region located in the substrate; a gate structure located in the substrate between the source region and the drain region; an insulating layer located between the gate structure and the drain region; a plurality of field plates located on the insulating layer, wherein the field plate closest to the gate structure is electrically connected to the source region; a first well region located in the substrate; a body contact region located in the first well region, wherein the body contact region is electrically connected to the source region and the field plate closest to the gate structure; and a first doped drift region located in the substrate, wherein the gate structure is located between the first well region and the first doped drift region, and the drain region is located in the first doped drift region.

In an embodiment of the invention, a method of fabricating a semiconductor device includes: forming a gate structure on a substrate, wherein the gate structure includes a gate dielectric layer and a gate conductive layer on the gate dielectric layer; forming a source region and a drain region in the substrate, wherein the gate structure is between the source region and the drain region; forming an insulating layer between the gate structure and the drain region; and forming a plurality of field plates on the insulating layer, wherein the field plate closest to the gate structure is electrically connected to the source region; forming a body contact region in the first well region, wherein the source region is located in the body contact region; and forming a body contact region in the body region, wherein the body contact region is electrically connected to the source region and the field plate closest to the gate structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

An embodiment of the invention provides a semiconductor device. This semiconductor device is, for example, a high-voltage transistor apparatus. The high-voltage transistor apparatus has field plates and the field plate closest to the gate structure is electrically connected to the source region to reduce gate-drain capacitance (Cgd) and switching power loss, and can make the devices have high breakdown voltage and low on-resistance.

The techniques disclosed herein may optimize the on-resistance and the breakdown voltage of a high-voltage transistor device. The high-voltage transistor device may be fabricated by a standard fabricating process, such as a triple-well process, a bipolar-complementary metal-oxide-semiconductor (CMOS)-double-diffused metal-oxide-semiconductor (DMOS) (BCD) process, a non-epitaxially-grown layer (non-EPI) process with a triple-well process or a twin-well process, and/or a single-poly or double-poly process. The high-voltage transistor device may be a low-side switching metal-oxide semiconductor (MOS) transistor, a high-side switching MOS transistor, a fully-isolated switching MOS transistor, or a high-voltage low-surface electric field (RESURF) LDMOS transistor. The high-voltage transistor may be an n-channel metal-oxide semiconductor (n-channel MOS, NMOS) transistor, a p-channel metal-oxide semiconductor (p-channel MOS, PMOS) transistor, or a complementary metal-oxide semiconductor (CMOS) transistor. The technique may be applied to any suitable structure, any suitable process, and/or any suitable operating voltage. In addition to high-voltage devices, the technique may also be used for direct-current (DC) applications and/or low-voltage applications.

The technique may be applied to any suitable transistor device in any suitable substrate. For illustrative purposes only, some examples in the following description are about an n-channel laterally-diffused metal-oxide semiconductor field-effect transistor (or LDMOS transistor) as a type of high-voltage transistor. The n-channel LDMOS transistor may be located in a p-type semiconductor substrate, or alternatively, may be located in a p-type epitaxial layer formed on the substrate. Some examples in the following description relate to the production of a single transistor by a fabricating process, or the formation of a plurality of transistors at the same time. In addition, in the following description, the p-type may be doped with boron or a boron fluoride ($BF_2$) dopant, for example; and the n-type may be doped with phosphorus or an arsenic dopant, for example.

FIG. 1A to FIG. 1G are cross-sectional views showing an exemplary fabricating process of a semiconductor device according to an embodiment of the invention.

Figure 1A:
FIG. 1A to FIG. 1G are cross-sectional views showing an exemplary fabricating process of a semiconductor device according to an embodiment of the invention.

Referring to FIG. 1A, isolation structures 104 are formed in a substrate 100. The substrate 100 is, for example, a p-type semiconductor substrate such as a p-type silicon substrate. The method of forming of the isolation structures 104 is, for instance, a shallow-trench isolation method. The steps of the shallow-trench isolation method are as follows. A plurality of trenches are formed in the substrate 100 by a lithography and etching process. Then, an insulating material is formed on the substrate 100 and in the trenches. Then, a planarization process is performed by a chemical mechanical polishing method or an etching-back method to remove the insulating material on a top surface of the substrate 100. The insulating material includes silicon oxide, silicon nitride, or a combination thereof formed by a chemical vapor deposition method or a thermal oxidation method.

Figure 1B:
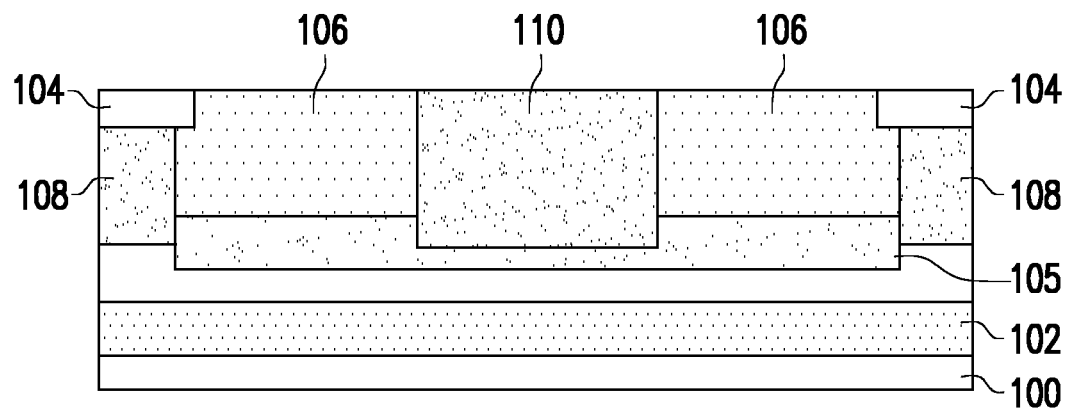

Referring to FIG. 1B, in the substrate 100, an n-type deep-well region 102, a p-type doped drift region 105, p-well regions 108 and 110, and n-type doped drift regions 106 are formed. The n-type deep-well region 102 is also referred to as an n-type doped buried layer. In some embodiments, the n-type deep-well region 102 is, for example, formed by an ion implantation process. In other embodiments, the n-type deep well region 102 may be an n-type epitaxial layer. In one example, the substrate 100 is a p-type substrate, and the n-type deep-well region 102 is embedded within the substrate 100. The substrate 100 is divided into an upper portion p-type substrate (no numeral) and a lower portion p-type substrate (no numeral). The formation method of the n-type epitaxial layer is, for example, performing an ion implantation process first, and then performing an epitaxial growth process.

The p-type doped drift region 105 is located in the substrate 100 below the active region between the isolation structures 104. The n-type doped drift regions 106 in formed on the p-type doped drift region 105. The n-type doped drift regions 106 are extended downward from the surface of the substrate 100 to the top surface of the p-type doped drift region 105. The p-type doped drift region 105 and the n-type doped drift region 106 may be formed sequentially using the same ion implantation mask. After the ion implantation mask is formed on the substrate 100, ion implantation processes are performed, and p-type dopants and n-type dopants are implanted into the substrate 100 in order to form p-type doped drift regions 105 and n-type doped drift region 106.

The p-well regions 108 are located below the isolation structures 104, and the bottom surfaces of the p-well regions 108 are deeper than the bottom surfaces of the isolation structures 104, and the sidewalls of the p-well regions 108 are adjacent to the sidewalls of the p-type deep-well region 105 and the n-type doped drift regions 106. The p-well region 110 is located between the p-well regions 108 and the bottom surface of the p-well region 110 is adjacent to the p-type deep-well region 105. Therefore, the p-well region 110, the p-well regions 108, and the p-type doped drift region 105 may jointly enclose the n-type doped drift regions 106 into two independent regions, and the transistor devices formed in these independent regions may be completely isolated from the substrate 100 to be able to be biased independently. The p-well regions 108 and 110 may be formed at the same time by using an ion implantation process. Therefore, the p-well regions 108 and 110 may have the same doping concentration.

The doping concentration of the p-type doped drift region 105 and the p-well regions 108 and 110 is slightly higher than the doping concentration of the substrate 100. The doping concentration of the p-type doped drift region 105 may be the same as the doping concentration of the p-well regions 108 and 110, and slightly higher or slightly lower than the doping concentration of the p-well regions 108 and 110. The doping concentration of the n-type doped drift regions 106 may be the same or slightly higher than the doping concentration of the p-type doped drift region 105.

Figure 1C:
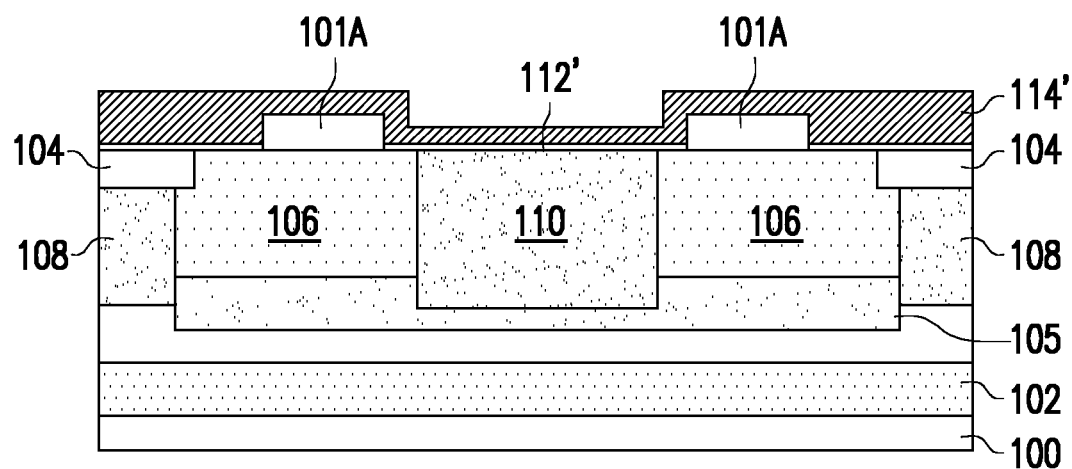

Referring to FIG. 1C, an insulating layer 101A is formed on each of the n-type doped drift regions 106. The method of forming of the insulating layers 101A, for example, is to first form an insulating material layer, such as a silicon oxide layer, and then perform patterning process via a lithography and etching to form the insulating layers 101A. Next, a gate dielectric material layer 112' and a conductive material layer 114' are formed on the substrate 100. The gate dielectric material layer 112' is, for example, silicon oxide formed by a thermal oxidation method. In the present embodiment, the thickness of the insulating layers 101A is greater than the thickness of the gate dielectric material layer 112'. Therefore, the insulating layers 101A and the gate dielectric material layer 112' form a step. The conductive material layer 114' covers the gate dielectric material layer 112' and the insulating layers 101A. The conductive material layer 114' is, for example, doped polysilicon deposited by a chemical vapor deposition method.

Figure 1D:
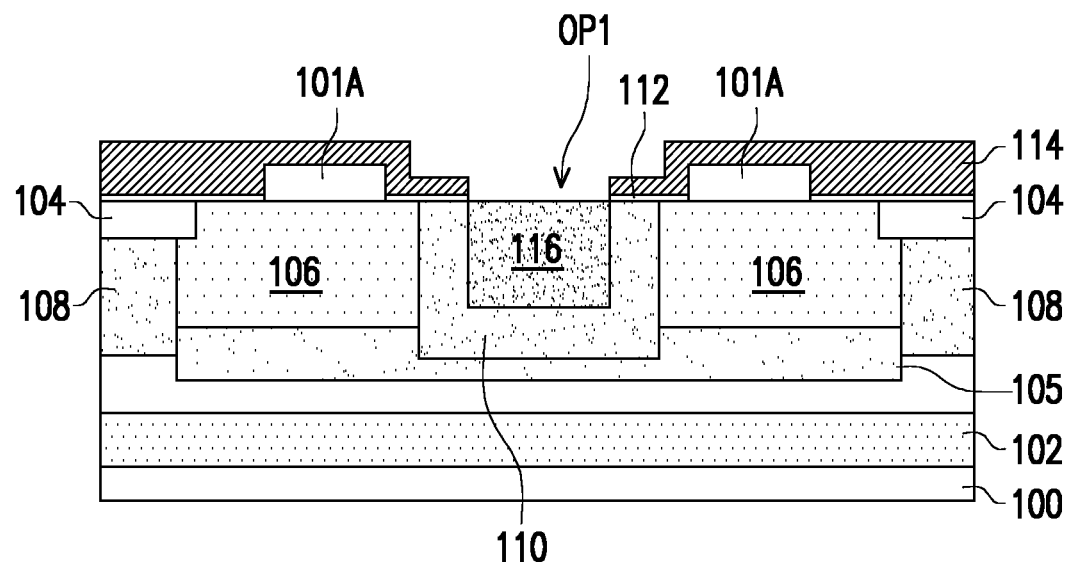

Referring to FIG. 1D, a patterning process is performed via a lithography and etching process to pattern the gate dielectric material layer 112' and the conductive material layer 114' to form gate dielectric layers 112 and conductive layers 114 with an opening OP1. The opening OP1 exposes the p-well region 110.

Referring to FIG. 1D, an ion implantation process is performed to implant a p-type dopant into the p-well region 110 exposed by the opening OP1 to form a p-type body region 116. The doping concentration of the p-type body region 116 is higher than the doping concentration of the p-well region 110, thereby defining the channel region of the device.

Figure 1E:
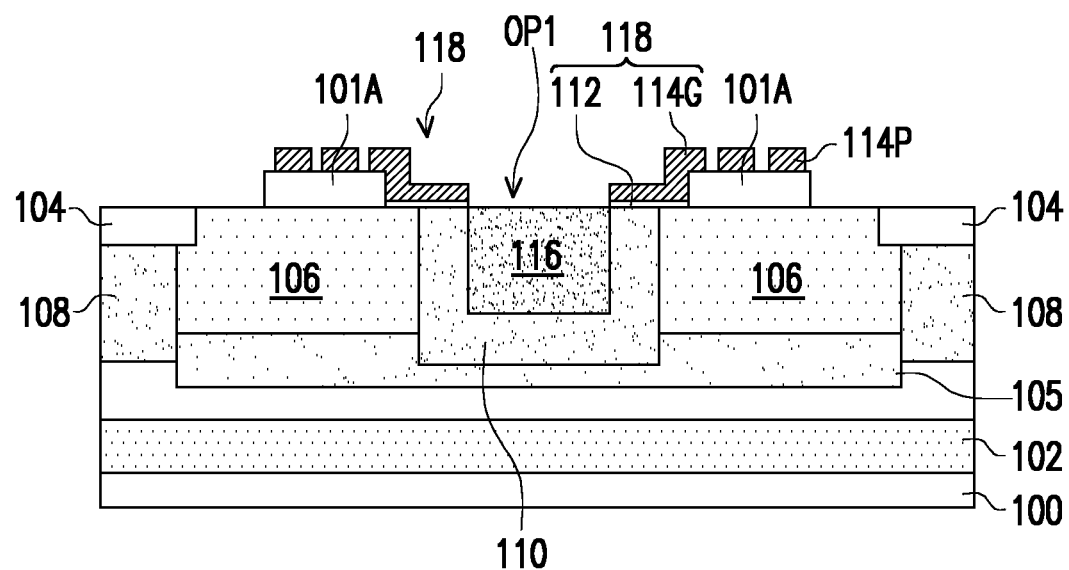

Referring to FIG. 1E, a patterning process is performed via a lithography and etching process to pattern the conductive layers 114 to form gate conductive layers 114G and a plurality of field plates 114P at the same time. The gate conductive layers 114G cover a portion of the gate dielectric layers 112 in a portion of the p-well region 110 and the n-type doped drift regions 106. Also, the gate conductive layers 114G extend to cover a portion of the insulating layers 101A. The gate conductive layers 114G and the gate dielectric layers 112 together form two gate structures 118. The plurality of field plates 114P are located on the insulating layers 101A. The width of the plurality of field plates 114P may be the same or different.

Figure 1F:
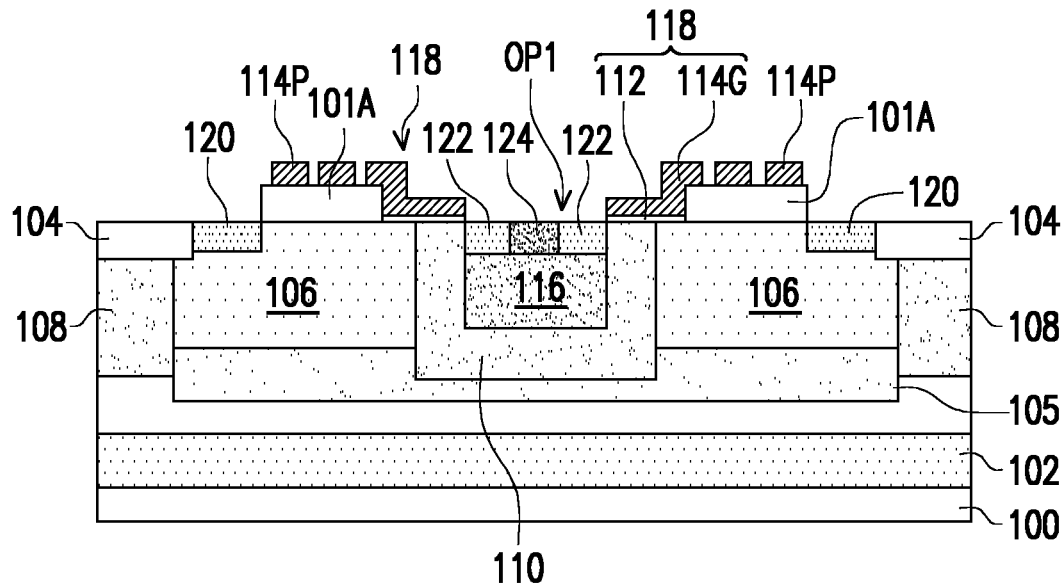

Referring to FIG. 1F, a p+ body contact region 124 and n+ source regions 122 are formed in the p-type body region 116. An n+ drain region 120 is formed in each of the two n-type doped drift regions 106. The doping concentration of the p+ body contact region 124 is higher than the doping concentration of the p-type body region 116. The doping concentration of the n+ source regions 122 and the n+ drain regions 120 is higher than the doping concentration of the n-type doped drift regions 106. The method of forming of the p+ body contact region 124, the n+ source regions 122, and the n+ drain regions 120 may, for example, respectively forming an implantation mask on the substrate 100, and then performing an ion implantation process to implant a p-type or n-type dopant in the substrate 100. Then, the implantation mask is removed. The n+ source regions 122 and the n+ drain regions 120 may be formed at the same time.

Figure 1G:
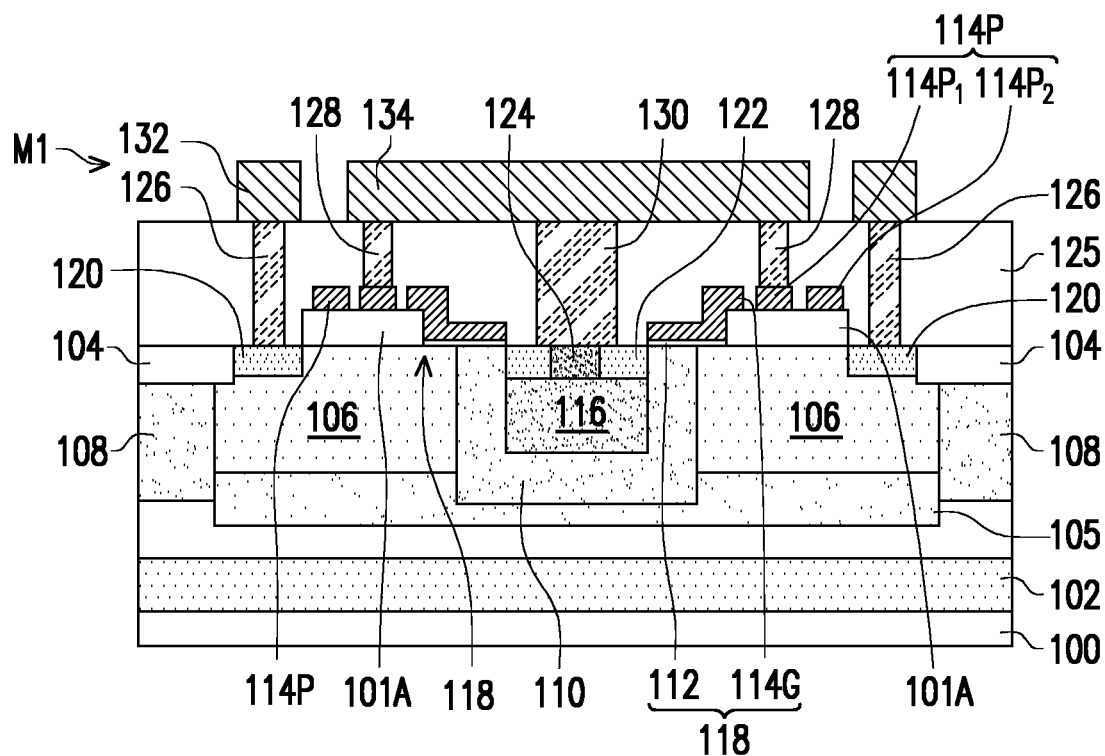

Referring to FIG. 1G, a dielectric layer 125 is formed on the substrate 100. Then, contacts 126, 128, and 130 are formed in the dielectric layer 125. The contacts 126, 128, and 130 are formed by, for example, lithography and etching to form contact holes in the dielectric layer 125, and then, a conductive material is formed on the dielectric layer 125 and in the contact holes. Then, the conductive material on the dielectric layer 125 and the conductive material remaining in the contact holes are used as the contacts 126, 128, and 130 via an etching-back or chemical mechanical polishing process. The contacts 126 are formed on and electrically connected to the n+ drain regions 120 The contacts 128 are formed on and electrically connected to the field plates 114P$_1$ closest to the gate structure 118. The contact 130 is formed on the p+ body contact region 124 and the n+ source regions 122 and is electrically connected to both.

Then, a conductive material layer is formed on the dielectric layer 125 and patterned to form conductive lines 132 and a conductive line 134 of a first conductive layer M1. The conductive lines 132 are electrically connected to the n+ drain regions 120 via the contacts 126. The conductive line 134 is electrically connected to the p+ body contact region 124 and the n+ source regions 122 via the contact 130 and electrically connected to the field plates 114P$_1$ closest to the two gate structures 118 via the contacts 128. The field plates 114P$_1$ closest to the two gate structures 118, the p+ body contact region 124, and the n+ source regions 122 are connected via the contacts 128, the contact 130, and the conductive line 134 to be equipotential.

In the above embodiment, there are two field plates 114P$_1$ and 114P$_2$ on each insulating layer 101A. However, the number of the field plates 114P may be more, as shown in FIG. 2.

Figure 2:
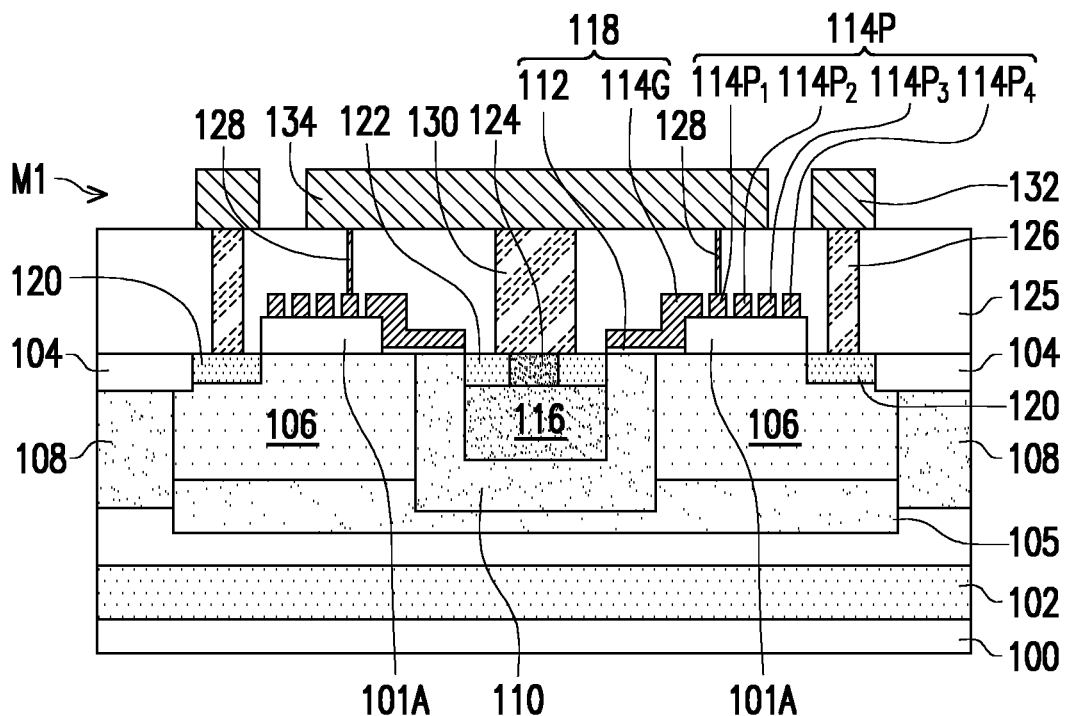
FIG. 2 to FIG. 12 show cross-sectional views of various semiconductor devices.

Referring to FIG. 2, the field plates 114P on each of the insulating layers 101A includes field plates 114P$_1$, 114P$_2$, 114P$_3$, and 114P$_4$. The contacts 128 are connected to the field plates 114P$_1$ closest to the gate conductive layers 114G in the field plates 114P. The field plates 114P$_1$, the p+ body contact region 124, and the n+ source regions 122 are connected via the contacts 128, the contact 130, and the conductive line 134 to be equipotential.

Figure 3:
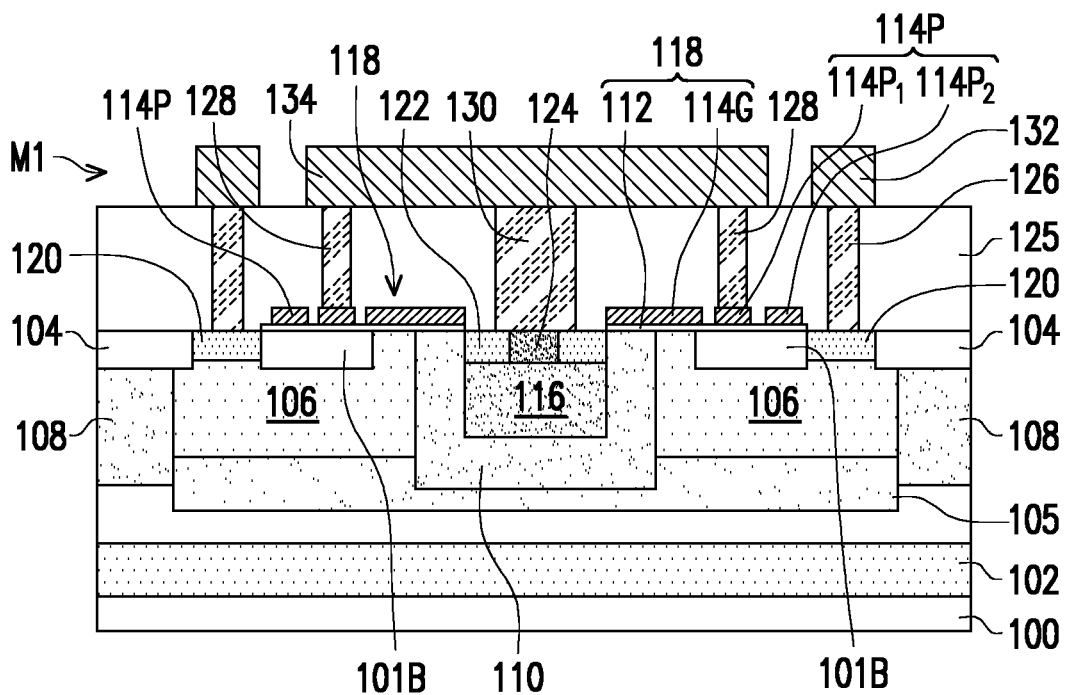
Figure 4:
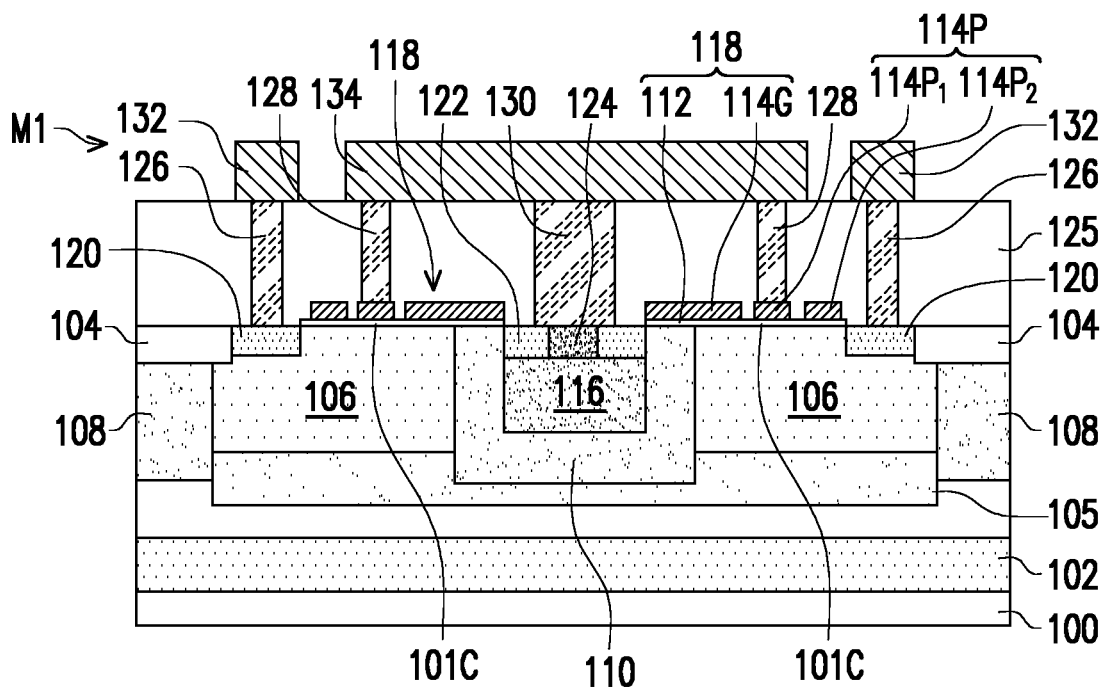

Furthermore, the insulating layers 101A of the above embodiment may also be formed by other methods (as shown in FIG. 3), or the insulating layers 101A (as shown in FIG. 4) are omitted.

Please refer to FIG. 3, insulating layers 101B of the present embodiment are formed in the n-type doped drift regions 106 of the substrate 100, and extending from the top surface of the doped drift region 106 toward a bottom surface of the substrate 100. Moreover, the n+ drain regions 120 are located between the insulating layers 101B and the isolation structures 104. The insulating layers 101B may be formed at the same time as the isolation structures 104 are formed, and may be formed by the method of forming the isolation structures 104.

Referring to FIG. 4, the insulating layers 101A of the above embodiment are omitted in the present embodiment. The gate dielectric layers 112 are extended to the doped drift regions 106. Both the field plates 114P and the gate conductive layers 114G land on the gate dielectric layers 112, and the gate dielectric layers 112 under the field plates 114P are in direct contact with the n-type doped drift regions 106, replacing the insulating layers 101A and serving as the insulating layers 101C. In the present embodiment, the insulating layers 101C are a portion of the gate dielectric layers 112. Therefore, the insulating layers 101C and the gate dielectric layers 112 are formed at the same time, and have the same material and the same thickness. That is, the height of the bottom surface of the insulating layer 101C may be the same as the height of the bottom surface of the isolation structure 104.

Furthermore, the insulating layers 101A of the above embodiment are single layers and are formed before the gate conductive layers 114G are formed, and the gate conductive layers 114G and the field plates 114P are formed at the same time. Therefore, the top surfaces of the insulating layers 101A are covered by the field plates 114P and are covered by the gate conductive layers 114G. However, in other embodiments, the insulating layers may be a plurality of layers, and the insulating layers and the field plates may also be formed at other time points. The gate conductive layers may be covered by field plates or separated from each other.

Figure 5:
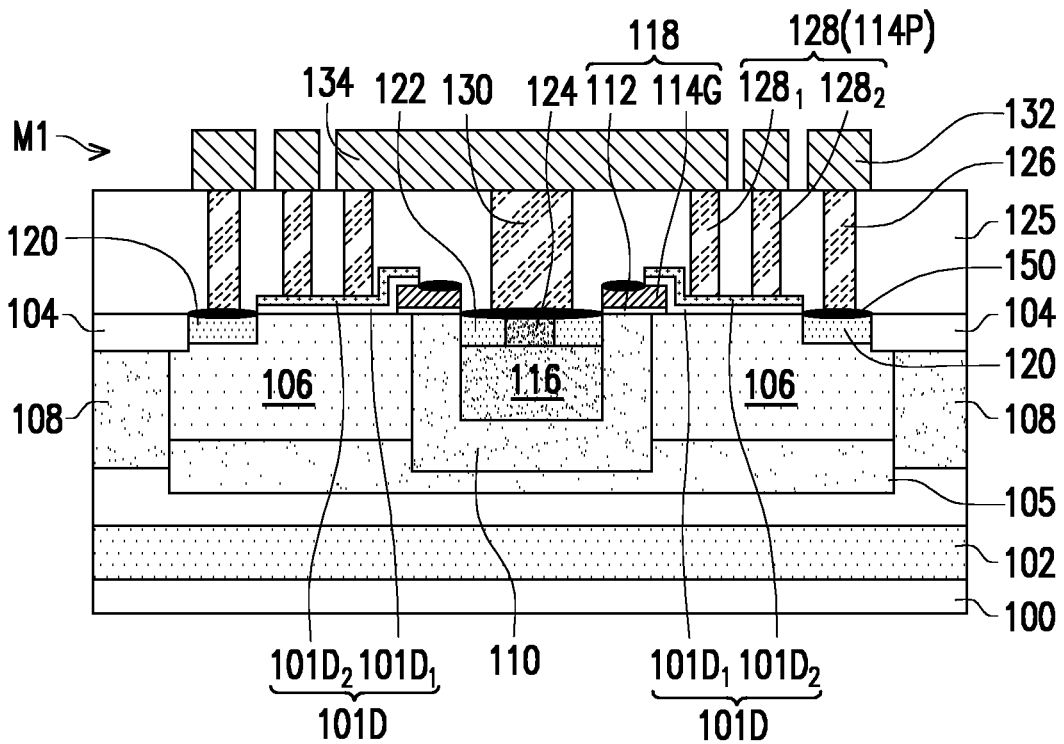

Referring to FIG. 5, insulating layers 101D and the field plates 114P in the present embodiment are formed after the gate structures 118 are formed. After the gate structures 118 are formed, blocking portions (PRO) are formed on the substrate 100 as the insulating layers 101D. The insulating layers 101D may be formed by, for example, forming an insulating material layer, and patterning the insulating material layer via lithography and etching process. The insulating layers 101D cover a portion of the gate structures 118 and the n-type doped drift regions 106, and expose another portion of the gate structures 118, the p+ body contact region 124, the n+ source regions 122, and the n+ drain regions 120. Then, a self-aligned silicide process is performed to form metal silicide layers 150 on the gate electrodes 114, the p+ body contact region 124, the n+ source regions 122, and the n+ drain regions 120. After the self-aligned silicide process is performed, the dielectric layer 125 is formed on the substrate 100, and subsequent processes such as forming the contacts 126, 128, and 130 are further performed.

The insulating layers 101D (blocking portions) may be single layers or a plurality of layers. In some examples, each of the insulating layers 101D (blocking portions) includes a material layer 101D$_1$ and a material layer 101D$_2$. The material layers 101D$_1$ are, for example, silicon oxide, and the material layers 101D$_2$ are, for example, silicon nitride. In the present embodiment, each of the contacts 128 includes contacts 128$_1$ and 128$_2$. The contacts 128$_1$ and 128$_2$ land on the material layers 101D$_2$ and are used as the field plates 114P. In other words, the field plates 114P of the present embodiment are formed after the gate structures 118 are formed, and are formed at the same time as the contacts 126 and 130 are formed. The top surfaces of the field plates 114P and the top surfaces of the contacts 128$_1$ and 128$_2$ are at a same level. The number of the contacts 128 as the field plates 114P may be designed according to the needs at different times. The conductive line 134 formed on the dielectric layer 125 may be directly connected to the contacts 128 and electrically connected to the p+ body contact region 124, and the n+ source regions 122 via the contact 130. The contacts 128 used as the field plates 114P include a conductive material such as a metal, a metal alloy, silicide, other suitable conductive materials, or a combination thereof. In some embodiments, the contacts 128 as the field plates 114P include titanium nitride, titanium, tungsten, or a combination thereof.

In the above embodiments of FIG. 1F to FIG. 5, the p+ body contact region 124 and the n+ source regions 122 and the field plates 114P at two sides thereof are connected via the first conductive layer M1. However, in the embodiments of the invention, the connection may also be established via other conductive line layers.

Figure 6:
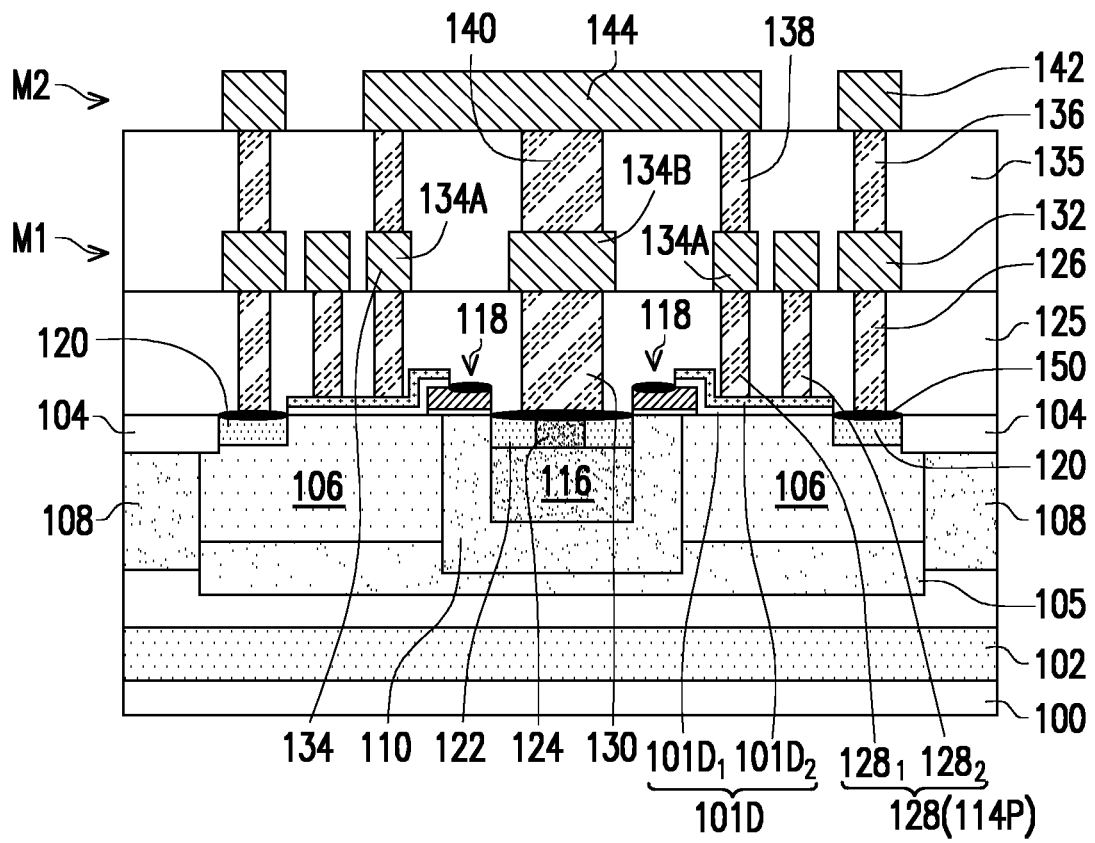

Referring to FIG. 6, after the contacts 126, 128, and 130 are formed according to the method of the above embodiment, the first conductive layer M1 is formed on the dielectric layer 125. The first conductive line layer M1 includes conductive lines 132, 134A, and 134B. The conductive lines 132, 134A, and 134B are separated from each other and connected to the contacts 126, 128$_1$, and 130, respectively. Then, a dielectric layer 135 is formed above the dieleclayer 125, and then vias 136, 138 and 140 are formed in the dielectric layer 135. Then, conductive lines 142 and 144 of a second conductive layer M2 are formed on the dielectric layer 135.

In the present embodiment, the p+ body contact region 124 and the n+ source regions 122 are connected to the conductive line 134B via the contact 130, and then connected to the conductive line 144 via the via 140. The contacts $128_1$ (used as the field plates 114P) located at two sides of the two gate structures 118 are connected to the conductive lines 134A, and then connected to the conductive line 144 via the vias 138. In other words, the p+ body contact region 124, the n+ source regions 122, and the contacts $128_1$ (used as the field plates 114P) are electrically connected via the second conductive line layer M2.

The semiconductor device of the above embodiment may also be called an LDMOS transistor. In some embodiments, under the premise of not affecting the normal operation of the device, some of the above well regions or doped regions may be omitted.

Figure 7:
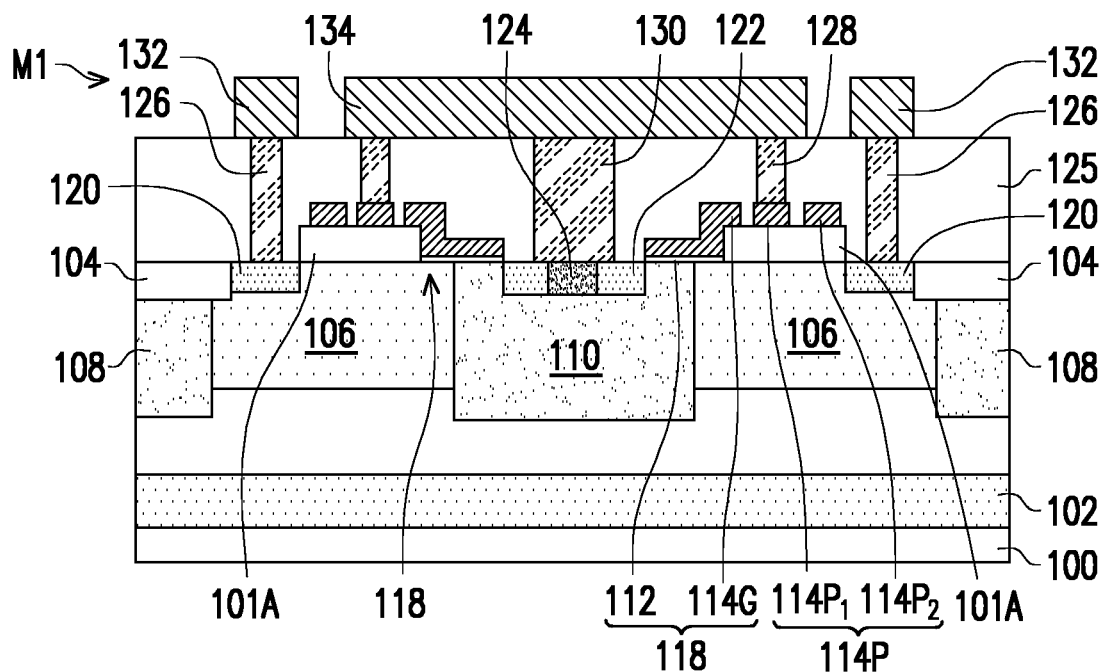
Figure 8:
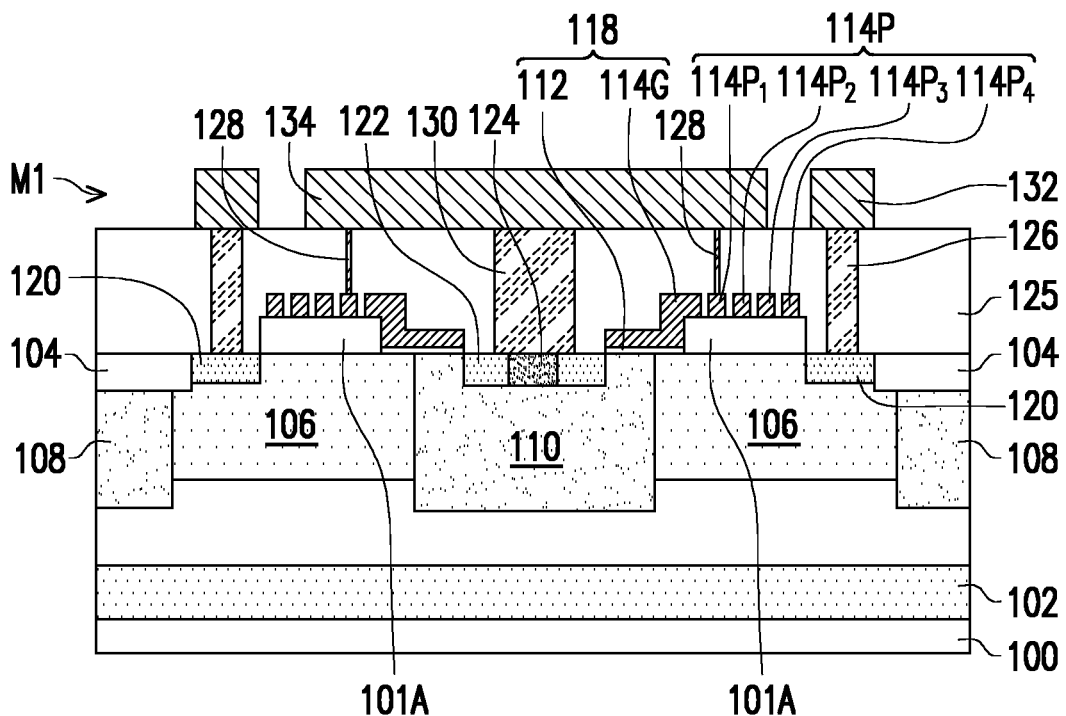
Figure 9:
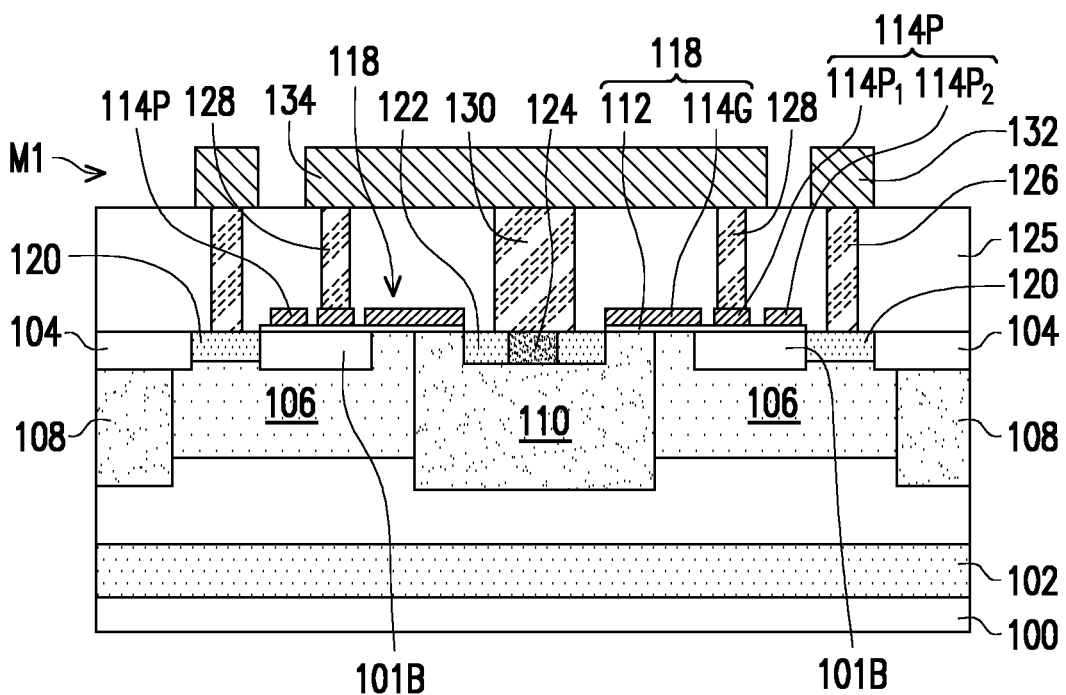
Figure 10:
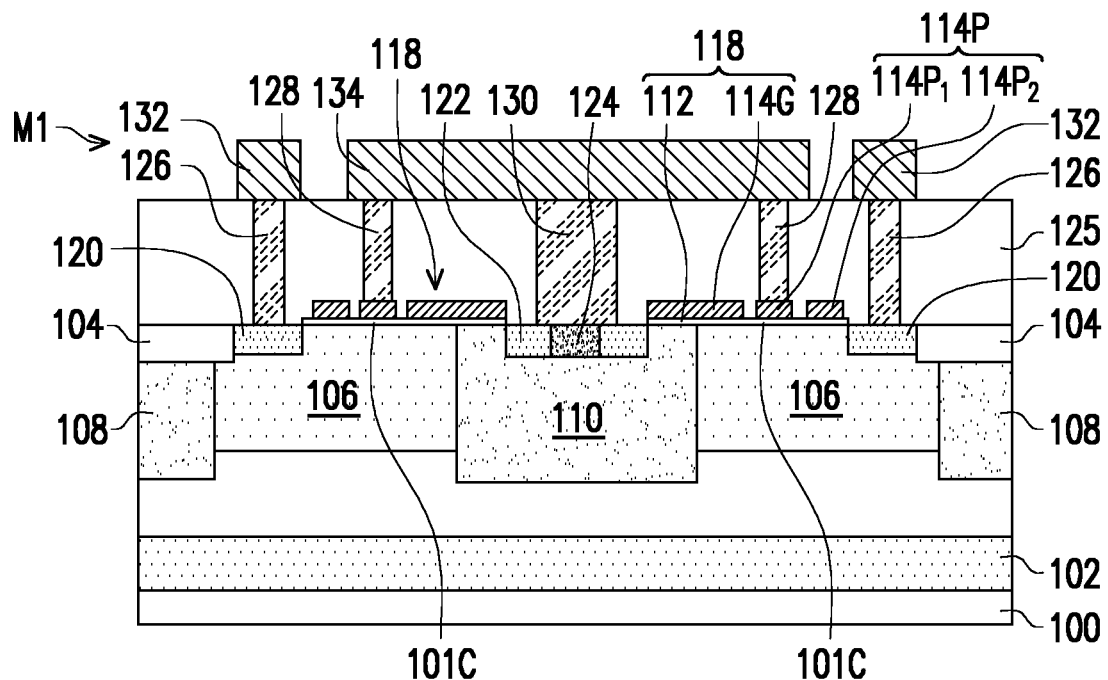
Figure 11:
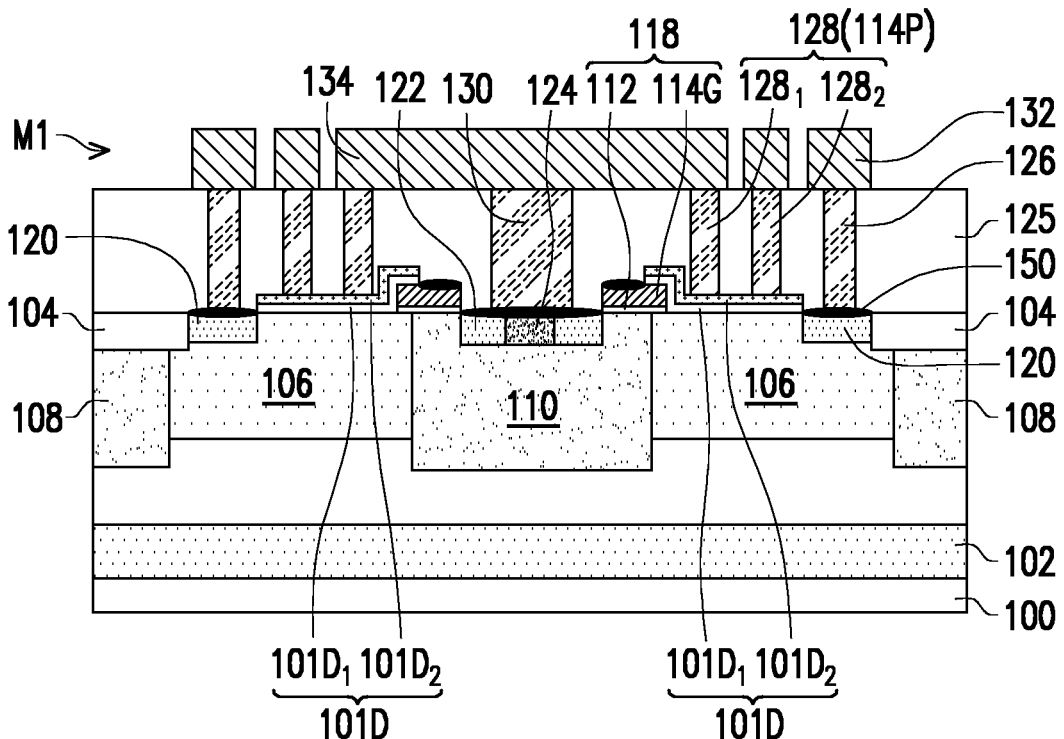
Figure 12:
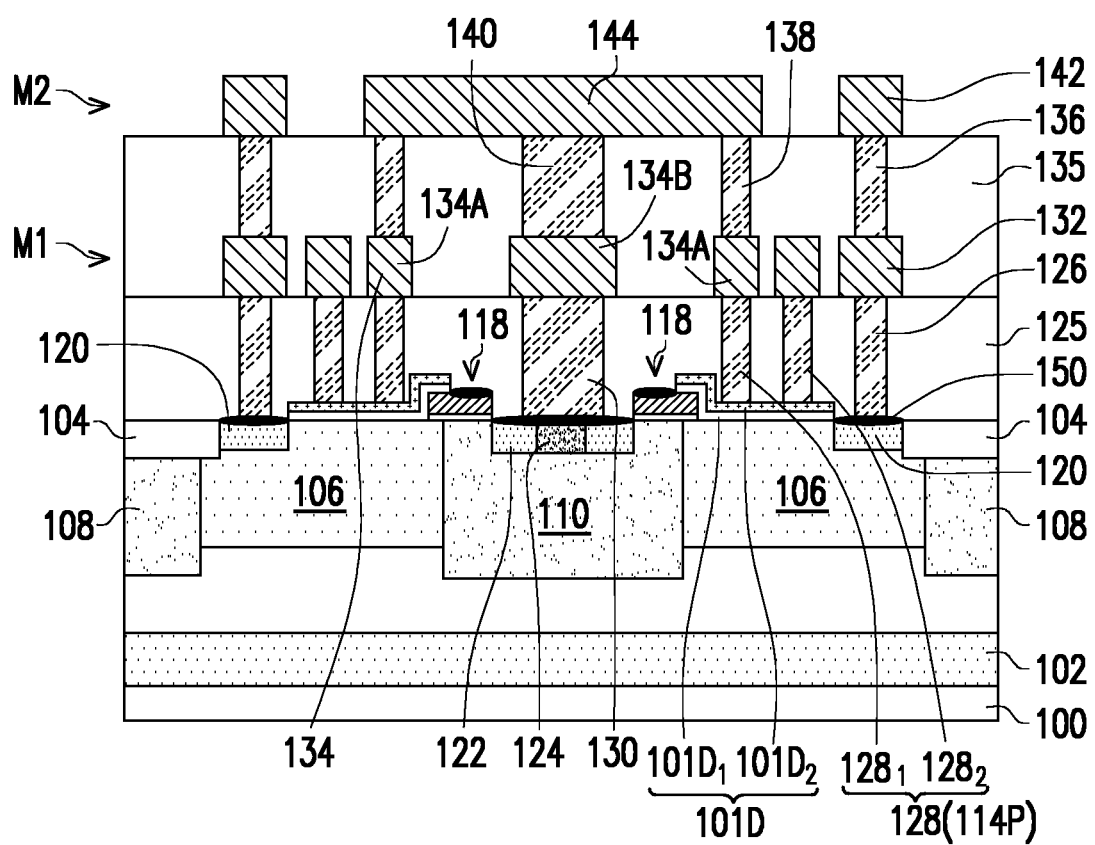

Please refer to FIG. 7, in the present embodiment, the p-type doped drift region 105 and the p-type body region 116 are omitted. The bottom surfaces of the p-well regions 108 and 110 are in contact with the substrate 100. The p+ body contact region 124 and the n+ source regions 122 are directly formed in the p-well region 110, and the bottom surface and the sidewalls thereof are in contact with the p-well region 110. This type of device may also be called an EDMOS transistor.

Similarly, the above FIG. 2 to FIG. 6 may also omit the p-type doped drift region 105 and the p-type body region 116 to form various EDMOS transistors, as shown in FIG. 8 to FIG. 12.

Based on the above, in an embodiment of the invention, a plurality of field plates are disposed between the gate structures and the drain regions. Electrically connecting the field plates closest to the gate structures with the body contact regions and the source regions can produce a Faraday shielding effect and reduce parasitic capacitance between the gates and the drains. As a result, the formed semiconductor device has low gate charge Qgd, thereby reducing switching power loss. Furthermore, floating other field plates can disperse the electric field, so that the device has high breakdown voltage and low on-resistance.

What is claimed is:
1. A semiconductor device, comprising:
a substrate;
a source region and a drain region located in the substrate;
a gate structure located on the substrate between the source region and the drain region;
an insulating layer located between the gate structure and the drain region;
a plurality of field plates located on the insulating layer, wherein only the field plate of plurality of field plates closest to the gate structure on the insulating layer is electrically connected to the source region;
a first well region located in the substrate;
a body contact region located in the first well region, wherein the body contact region is electrically connected to the source region and the field plate closest to the gate structure;
a first doped drift region located in the substrate, wherein the gate structure is located between the first well region and the first doped drift region, and the drain region is located in the first doped drift region; and
a body region located in the first well region, wherein the body contact region and the source region are located in the body region;
a second well region located in the substrate, wherein the first doped drift region is located between the first well region and the second well region;
a second doped drift region located in the substrate below the first doped drift region; and
a deep-well region located between the first doped drift region and the second doped drift region and adjacent to a bottom surface of the first doped drift region and sidewalls of the first well region and the second well region.

2. The semiconductor device of claim 1, wherein the insulating layer is located on a top surface of the first doped drift region.

3. The semiconductor device of claim 1, wherein the insulating layer is extended from the top surface of the first doped drift region toward a bottom surface of the substrate.

4. The semiconductor device of claim 2, further comprising an isolation structure located in the substrate, wherein a height of a bottom surface of the insulating layer is the same as a height of a bottom surface of the isolation structure.

5. The semiconductor device of claim 1, wherein a thickness of the insulating layer is greater than or equal to a thickness of a gate dielectric layer of the gate structure.

6. The semiconductor device of to claim 5, wherein a thickness of the plurality of field plates is the same as a thickness of a gate conductive layer of the gate structure.

7. The semiconductor device of claim 6, wherein the insulating layer partially covers a sidewall and a top surface of the gate structure.

8. The semiconductor device of claim 7, further comprising:
a contact connected to the source region, wherein a height of a top surface of the plurality of field plates is the same as a height of a top surface of the contact.

9. The semiconductor device of claim 1, wherein the field plate closest to the gate structure and the source region are electrically connected via a first conductive layer or a second conductive layer.

10. A method of fabricating a semiconductor device, comprising:
forming a gate structure on a substrate, wherein the gate structure comprises a gate dielectric layer and a gate conductive layer on the gate dielectric layer;
forming a source region and a drain region in the substrate, wherein the gate structure is between the source region and the drain region;
forming an insulating layer between the gate structure and the drain region; and
forming a plurality of field plates on the insulating layer, wherein only the field plate of plurality of field plates closest to the gate structure on the insulating layer is electrically connected to the source region;
forming a first well region in the substrate and a second well region in the substrate;
forming a body region in the first well region, wherein the body contact region and the source region are located in the body region;
forming a body contact region in the body region, wherein the body contact region is electrically connected to the source region and the field plate closest to the gate structure;
forming a first doped drift region in the substrate between the first well region and the second well region, wherein the gate structure is located between the first well region and the first doped drift region, and the drain region is located in the first doped drift region;

forming a second doped drift region in the substrate below the first doped drift region; and forming a deep-well region between the first doped drift region and the second doped drift region and adjacent to a bottom surface of the first doped drift region and sidewalls of the first well region and the second well region.

11. The method of fabricating the semiconductor device of claim 10, further comprising:

forming a gate dielectric material layer and a conductive material layer on the substrate; and patterning the gate dielectric material layer and the conductive material layer to form the gate dielectric layer and a conductive layer having an opening, wherein the opening exposes the first well region, and the source region is located in the first well region.

12. The method of fabricating the semiconductor device of claim 11, wherein the gate dielectric layer is further extended onto the first doped drift region as the insulating layer, and the conductive layer comprises the gate conductive layer and the plurality of field plates.

13. The method of fabricating the semiconductor device of claim 11, further comprising patterning the conductive layer to form the gate conductive layer and the plurality of field plates.

14. The method of fabricating the semiconductor device of claim 11, wherein the insulating layer is formed above the substrate in the first doped drift region.

15. The method of fabricating the semiconductor device of claim 10, further comprising forming an isolation structure in the substrate, wherein the insulating layer and the isolation structure are formed at a same depth.

16. The method of fabricating the semiconductor device of claim 10, wherein the insulating layer is formed on the gate structure and the first doped drift region, and top surfaces of the plurality of field plates and a top surface of a contact connected to the drain regions are at a same level.

* * * * *